US 6,731,171 B2

(12) United States Patent
Yamashita

(10) Patent No.: US 6,731,171 B2
(45) Date of Patent: May 4, 2004

(54) POWER AMPLIFIER MODULE WITH STABLE IDLING CURRENT

(75) Inventor: Kiichi Yamashita, Shiroyama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/080,558

(22) Filed: Feb. 25, 2002

(65) Prior Publication Data

US 2002/0135423 A1 Sep. 26, 2002

(30) Foreign Application Priority Data

Mar. 21, 2001 (JP) .................................... 2001-081143

(51) Int. Cl.[7] ................................................. H03G 3/30
(52) U.S. Cl. ...................................... 330/285; 330/289
(58) Field of Search .............................. 330/285, 289, 330/302

(56) References Cited

U.S. PATENT DOCUMENTS

| | | | | |
|---|---|---|---|---|
| 5,724,004 A | * | 3/1998 | Reif et al. ................... 330/289 |
| 5,990,746 A | * | 11/1999 | Samuels ...................... 330/285 |
| 6,052,032 A | * | 4/2000 | Jarvinen ...................... 330/289 |
| 6,215,358 B1 | * | 4/2001 | Hon et al. ................... 330/289 |
| 6,359,948 B1 | * | 3/2002 | Turudic et al. ............. 375/376 |
| 6,472,937 B1 | * | 10/2002 | Gerard et al. ............... 330/285 |

OTHER PUBLICATIONS

"Thermally stable power HBT by the bias circuit using Schottky diode" Keiichi Murayama et al., Semiconductor Device Research Center, Matsushita Electronics Corporation, pp. 1–4 and p. 65.

* cited by examiner

Primary Examiner—Khanh Van Nguyen
(74) Attorney, Agent, or Firm—Antonelli, Terry, Stout & Kraus, LLP

(57) ABSTRACT

A power amplifier module includes a bias circuit to produce an idling current and a power amplifier of which the gain is controlled by the idling current produced by the bias circuit. Effects of changes of control voltage and ambient temperature of the power amplifier module can be removed by a first detector in the bias circuit to detect changes of the control voltage and a second detector in the bias circuit to detect changes of the ambient temperature. The bias circuit may further include a differential circuit to make error amplification with the first detector provided to perform as a standard voltage source for ambient temperature detection of the second detector and the second detector provided to perform as a standard voltage source for control-voltage detection of the first detector. Thus, they serve as detection circuits or standard voltage sources mutually.

15 Claims, 7 Drawing Sheets

POWER AMPLIFIER MODULE WITH STABLE IDLING CURRENT

BACKGROUND OF THE INVENTION

1. Field of the Invention

The present invention relates to a power amplifier module. More specifically, the present invention relates to technology effectively applicable to power amplifier modules for, e.g., cellular phones which need to keep high linearity under environmental changes such as changes of ambient temperature and control voltage.

2. Description of the Related Art

Portable telephones used in CDMA (Code Division Multiple Access), PDC (Personal Digital Cellular), TDMA (Time Division Multiple Access), and other systems are required to have high linearity and efficiency under environmental changes such as changes of ambient temperature and control voltage. To meet this requirement without allowing the performance of the telephone to drop, it is essential to maintain a stable operating point (idling current) of the power amplifier, which, among other components of the telephone has the greatest influence on the linearity and efficiency of the telephone, under environmental changes such as changes of ambient temperature and control voltage.

FIGS. 11A and 11B show examples of power amplifiers using GaAs-HBTs (Heterojunction Bipolar Transistors) presented in the C-10-7 of the 2000 General Conference of the Institute of Electronics, Information and Communication Engineers. FIG. 11A shows one of the unit amplifiers of a power amplifier. Reference numeral 1 is a power terminal; 14, a grounding terminal; 2, a control terminal; 8, an input terminal; 11, an output terminal; 22 to 24 and 28, GaAs-HBTs (hereinafter simply referred to as "transistors"); 21, 25, and 26, resistors; 27, a coupling capacitance; 29, an RF choke inductor; and 15, a bias circuit comprised of some of the above parts.

In the circuit of FIG. 11A, the transistors 24 and 28 connected by a Darlington connection and the transistors 22 and 23 connected by a diode connection constitute a current mirror circuit. If the ratio of the current mirror is set to "n" by setting the emitter area of the transistor 28 "n" times as large as the emitter area of the transistors 22 and 23, a current Iq, which is "n" times as large as a current Ib passing through the transistors 22 and 23 in the diode configuration, passes through the amplifying transistor 28 as an idling current. Keeping the current Ib constant is, therefore, important to stabilize the idling current Iq.

An input signal is input through the input terminal 8, amplified by the amplifying transistor 28, and output through the output terminal 11. A matching circuit (not shown) is connected to the input terminal 8; another matching circuit (not shown), to the output terminal 11. The resistor 26 and the RF choke inductor 29 are used to isolate signal components from the bias circuit 15 and the power line of low impedance.

In the circuit of FIG. 11B, an idling current Iq is stabilized by offsetting the temperature characteristics of base-emitter voltage of transistors 24 and 28 by the temperature characteristics of Schottky diodes 30 to 33 connected in series in bias circuit 15. Although the threshold voltage of the Schottky diode is about a half of that of the GaAs-HBT, the former's temperature characteristics are almost the same as the temperature characteristics of base-emitter voltage of the latter. It is therefore possible to connect in series twice as many Schottky diodes as GaAs-HBTs, and any desired temperature compensation effect can be accomplished by changing the ratio of the resistance of resistor 21 to the resistance of resistor 36. In this unit amplifier, four Schottky diodes are connected in series to obtain temperature characteristics of the idling current Iq of a practical level. Reference numerals 34 and 35 also indicate Schottky diodes, which are dispensable from the point of view of the basic function of the unit amplifier.

SUMMARY OF THE INVENTION

The power amplifier of FIG. 11A is simple in configuration and has an advantage that all active elements can be formed by a transistor process. However, because a current Ireg passing through the resistor 21 is governed by: (i) the difference between the voltage at the control terminal 2 and the sum of the base-emitter voltage of the transistor 22 and that of the transistor 23; and (ii) the resistance of the resistor 21, the current Ireg varies in accordance with changes of ambient temperature and control voltage. The current Ib changes in proportion to the current Ireg. In other words, no means is provided for stabilizing the idling current Iq when changes of ambient temperature and control voltage occur. Therefore, the dependency of the idling current Iq on the ambient temperature and the control voltage is large. In addition, it is difficult to achieve a high yield because the performance of the unit amplifier is liable to be affected by the deviation in manufacture of resistors 21. When the control voltage is 2.8 V and the ambient temperature varies within a range of 30±60° C., the idling current varies within a range larger than ±40%. When the ambient temperature is 30° C. and the control voltage lowers from 2.8 V to 2.7 V, the idling current Iq is reduced by 30% or so.

The idling current of the unit amplifier of FIG. 11B is stabilized by using Schottky diodes. This method, however, requires a Schottky diode process which is different from the GaAs-HBT process. Because it is difficult to stably control Schottky barriers and electrode contact in a Schottky diode process, it is difficult to manufacture power amplifiers at high repeatability and a high yield. As in the case of the unit amplifier of FIG. 11A, the unit amplifier of FIG. 11B has no means for stabilizing the idling current when a variation of the control voltage occurs. Accordingly, the idling current is reduced by 50% or so when the control voltage lowers from 2.8 V to 2.7 V.

In accordance with the above, an object of the present invention is to provide a power amplifier module with a bias circuit capable of feeding stable idling currents to power amplifier units. Another object of the present invention is to provide a power amplifier module which can be manufactured at low cost and a high yield by forming a bias circuit and power amplifier units in a stable transistor process.

A representative example of the invention disclosed in this application is as follows. A differential circuit provides error amplification with a first arrangement to detect changes of the control voltage and a second arrangement to detect changes of ambient temperature as mutual standard voltage inputs to produce an idling current. As a result, the effects of the changes of the control voltage and the ambient temperature are removed. The idling current controls the gain of a power-amplifying transistor. Input signals are fed to the power-amplifying transistor through a first matching circuit, and output signals from the power-amplifying transistor are fed to a load circuit through a second matching circuit.

Other and further objects, features and advantages of the invention will appear more fully from the following description.

BRIEF DESCRIPTION OF THE DRAWINGS

A preferred form of the present invention is illustrated in the accompanying drawings in which.

DESCRIPTION OF THE PREFERRED EMBODIMENTS

Preferred embodiments of the present invention will now be described with reference to the accompanying drawings.

Figure 1:
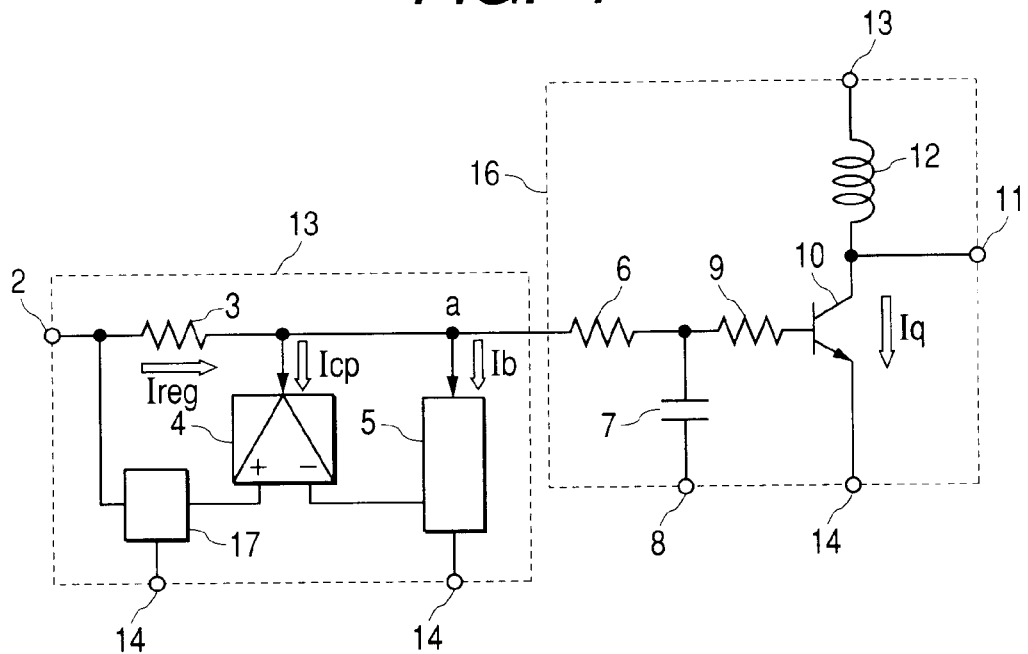
FIG. 1 is a circuit diagram showing a basic configuration of a power amplifier module embodying the present invention.

FIG. 1 is a circuit diagram showing a basic configuration of a power amplifier module embodying the present invention. In general, a power amplifier module for portable telephones described earlier consists of two or three unit amplifiers. This embodiment of the present invention presents such a unit amplifier. The unit amplifier of this embodiment comprises: (i) a power amplifier unit 16 including an amplifying transistor 10 which is, for example, a GaAs-HBT, coupling capacitance 7, resistors 6 and 9, and an RF choke inductor 12; and (ii) a bias circuit 15 including an error amplifier circuit 4, a temperature detection circuit/standard voltage source for control voltage detection 5, a control voltage detection circuit/standard voltage source for temperature detection 17, and a resistor 3. Reference numerals 13 and 14 are a power terminal and a grounding terminal, respectively.

The working principle of the unit amplifier of FIG. 1 will now be described. A high-frequency signal, which is input through a terminal 8, is sent through the coupling capacitance 7 to the amplifying transistor 10 to be amplified thereby and output through a terminal 11. An input matching circuit (not shown) is connected to the terminal 8; an output matching circuit (not shown), to the terminal 11. Accordingly input signals are sent through the input matching circuit to the terminal 8, and output signals, which are output through the terminal 11, drive a load (antenna), etc. through the output matching circuit. The resistor 9 stabilizes the working of the amplifying transistor 10. Even if the resistor 9 is short-circuited, the basic working of the amplifying transistor 10 remains the same. The resistor 6 and the inductor 12 are used to shut out high-frequency signals. In other words, they are used to isolate signal components from the bias circuit 15 and the power line of low impedance.

An idling current is fed to the amplifying transistor 10 as follows. A positive-pole terminal and a negative pole terminal of the error amplifier circuit 4 are connected to the control-voltage detection circuit/standard voltage source for temperature detection 17 and the temperature detection circuit/standard voltage source for control-voltage detection 5, respectively. The voltage at the positive- and negative-pole terminals and circuit parameters are set so as to render a current Ireg passing through the resistor 3 and currents Ib and Icp equal to their respective prescribed values. When the ambient temperature rises, the electric potential at an "a" point and the negative pole terminal lowers. When the electric potential at the "a" point lowers, the current Ireg increases; accordingly, the current Ib and the idling current Iq passing through the amplifying transistor 10 increase.

When the negative pole's electric potential of the error amplifier circuit 4 lowers, the current Icp into the error amplifier circuit 4 increases because the positive pole's electric potential is constant. Therefore, the increase of the current Ib can be held down by designing the error amplifier circuit 4 so as to render the increments of the currents Ireg and Icp equal to each other.

Considered next is a case where the control voltage rises while the ambient temperature is constant. In this case, the current Ib is kept constant to stabilize the idling current Iq by offsetting the increment of the current Ireg by increasing the current Icp into the error amplifier circuit 4.

According to the present invention, a bias circuit is provided with detection circuits for detecting the changes of ambient temperature and control voltage and an error amplifier circuit for amplifying the changes of ambient temperature and control voltage detected by the detection circuits. Because the current Ireg varies as the ambient temperature and the control voltage vary, the variation of the current Ireg is offset by feeding a current 11 corresponding to the variation to the error amplifier circuit so as to keep the current Ib constant and feed a stable idling current to a power amplifier unit. The above embodiment is characterized by a temperature detection circuit which not only detects the ambient temperature but also serves as a standard voltage source for control-voltage detection and a control-voltage detection circuit which not only detects the control voltage but also serves as a standard voltage source for temperature detection. Thus, they serve as detection circuits and standard voltage sources mutually.

Figure 2:
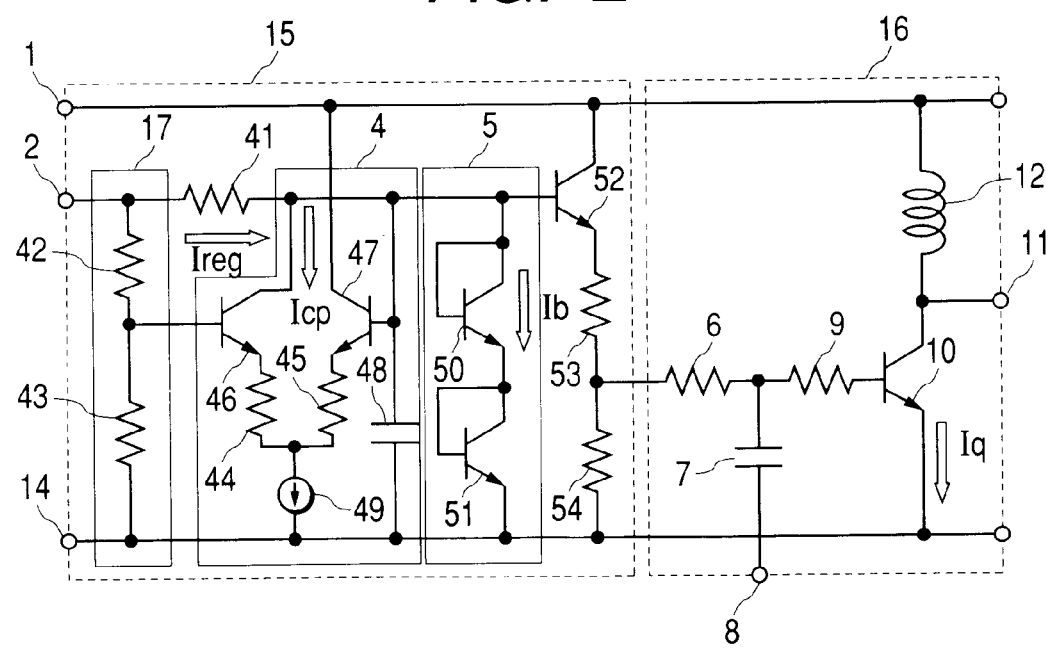
FIG. 2 is a specific circuit diagram of an embodiment of the unit amplifier of FIG. 1.

FIG. 2 is a specific circuit diagram of an embodiment of the unit amplifier of FIG. 1. The control-voltage detection circuit/standard voltage source for temperature detection 17 comprises resistors 42 and 43 connected in series. The connection between the resistor 42 and the terminal 2 is the point for control-voltage detection, and the connection between the resistors 42 and 43 is the reference point for temperature detection. The temperature detection circuit/standard voltage source for control-voltage detection 5 comprises GaAs-HBTs 50 and 51 (hereinafter referred to as "transistors") in a series diode configuration. The connection between the collector and the base of the transistor 50 is the point for temperature detection or the reference point for control-voltage detection. Capacitance 48 is used to smooth the high-frequency components of a current passing through the base during the high-frequency operation of the amplifying transistor 10 and thereby stabilize the workings of the amplifying transistor 10. The capacitance 48, however, is dispensable.

The error amplifier circuit 4 is a differential circuit including GaAs-HBTs 46 and 47 (hereinafter referred to as "transistors"). Emitter resistors 44 and 45 are provided to expand the dynamic range of the differential circuit. Reference numeral 49 is a current source, which can be made of a resistor or a resistor and a transistor. Fed to the base of the differential transistor 46 is the divided voltage of voltage dividing resistors 42 and 43 constituting the control-voltage detection circuit/standard voltage source for temperature detection 17. Fed to the base of the differential transistor 47 is the voltage of the connection between the base and the collector of the transistor 50, the connection being the detection point of the temperature detection circuit/standard voltage source for control-voltage detection 5. In other words, fed to the base of the differential transistor 47 is the voltage drop at the resistor 41 which causes the current Ireg.

A transistor 52 is connected to the amplifying transistor 10 by a Darlington connection. The transistors 50 and 51 in the diode configuration and the transistors 52 and 10 constitute a current mirror; accordingly, if the resistor 53 is short-circuited, the basic workings remain the same. The configuration of the other part of the unit amplifier is the same as the counter part of the unit amplifier of FIG. 1, accordingly, its description is omitted.

If the unit amplifier is not provided with an error amplifier circuit 4, and the ambient temperature rises, the base-emitter voltage of the transistors 50 and 51 lowers. Accordingly, the electric potential of the base of the differential transistor 47 lowers, the voltage across the resistor 41 rises, the currents Ireg and Ib increase, and, hence, the idling current Iq increases due to the current mirror effect between the transistors 50 and 51 and the transistors 52 and 10. On the other hand, if the unit amplifier is provided with an error amplifier circuit as shown in FIG. 2, and the electric potential of the base of the differential transistor 47 lowers below that of the differential transistor 46, more electricity fed from the current source 49 passes through the differential transistor 46, increasing the current Icp. Because circuit parameters are determined so as to render the increments of the currents Icp and Ireg equal to each other, the current Ib is kept constant, and, thereby, the idling current Iq is kept stable.

If the unit amplifier is not provided with an error amplifier circuit 4, and the control voltage rises while the ambient temperature is stable, the voltage across the resistor 41 rises, increasing the currents Ireg and Ib and the idling current Iq because the base-emitter voltage of the transistors 50 and 51 does not change, and, hence, the electric potential of the base of the transistor 47 is kept constant. On the other hand, if the unit amplifier is provided with an error amplifier circuit, as shown in FIG. 2, the electric potential of the base of the differential transistor 46 rises over that of the other differential transistor 47; accordingly, more electricity fed from the current source 49 passes through the differential transistor 46, increasing the current Icp. Because circuit parameters are determined so as to render the increments of the currents Icp and Ireg equal to each other, the current Ib is kept constant, and, thereby, the idling current Iq is kept stable.

Figure 3:
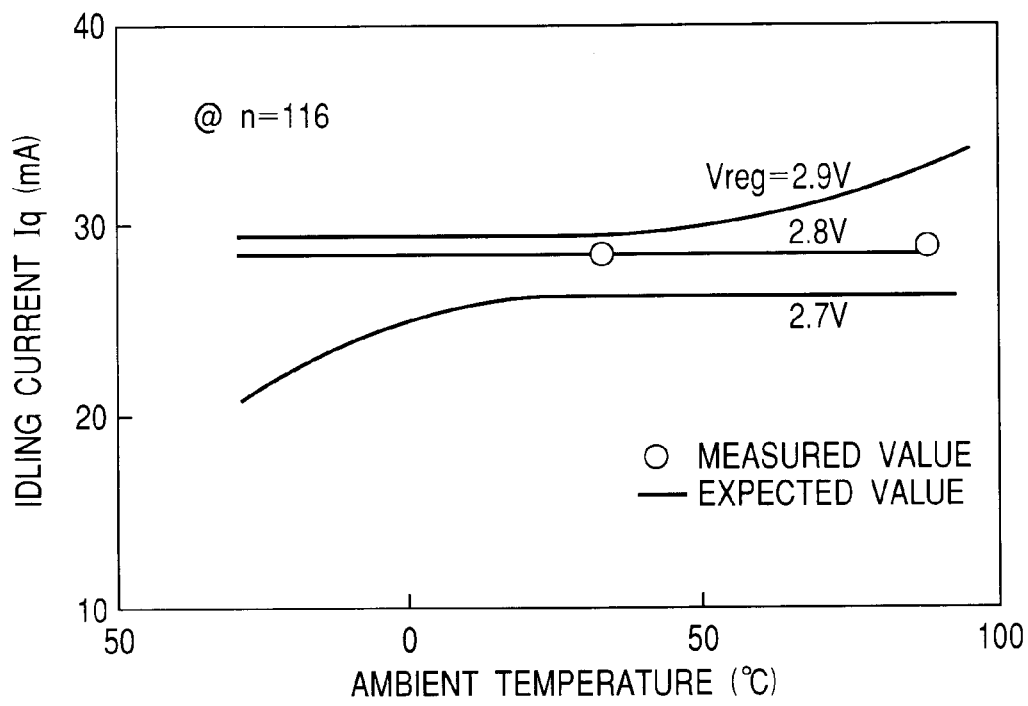
FIG. 3 shows the ambient temperature-idling current characteristic curves of the unit amplifier of FIG. 2.

In actual circuit design, the circuit parameters are determined from the viewpoint of both ambient temperature and control voltage variations. FIG. 3 shows the ambient temperature-idling current characteristic curves of the unit amplifier of FIG. 2. The curves represent simulation results and actual measurements based on the following conditions: resistance of resistor 41, 400 Ω; base-emitter voltage of transistors 50 and 51, 2.5 V (two-stage connection); its change, −2.4 mV/° C.; temperature range, 30±60° C.; control voltage, 2.8 V; its range 0.1 V; current Ib, 0.25 mA; and current mirror ratio (n), 116.

According to the simulation, the idling current Iq is stable in the temperature range of ±60° C. under the control voltage of 2.8 V. This simulation result was supported by actual measurement wherein the idling current Iq changed about 5% in the range from 30° C. to 90° C. It is apparent that if the GaAs-HBTs in FIG. 2 are replaced with SiGe-HBTs or Si bipolar transistors, the same compensation effect can be accomplished.

As described above, if the ambient temperature rises, the sum of the base-emitter voltage of the transistor 50 and that of the transistor 51 lowers, and, hence, the current Ireg increases. If a current equivalent to the increment of the current Ireg is passed through the error amplifier circuit 4, the current Ib passing through the transistors 50 and 51 is kept constant. During the temperature compensation, a control-voltage detection circuit 17 serves as a standard voltage source for temperature detection too. If the control voltage rises, the current Ireg increases because the sum of the base-emitter voltage of the transistor 50 and that of the transistor 51 is constant. If a current equivalent to the increment of the current Ireg is passed through the error amplifier circuit 4, the current Ib passing through the transistors 50 and 51 is kept constant. During the control-voltage compensation, a temperature detection circuit 5 serves as a standard voltage source for control-voltage detection as well. Thus, from a functional point of view, the control-voltage detection circuit 17 becomes a control-voltage detection circuit/standard voltage source for temperature detection 17 and the temperature detection circuit 5 becomes a temperature detection circuit/standard voltage source for control-voltage detection 5.

Figure 4:
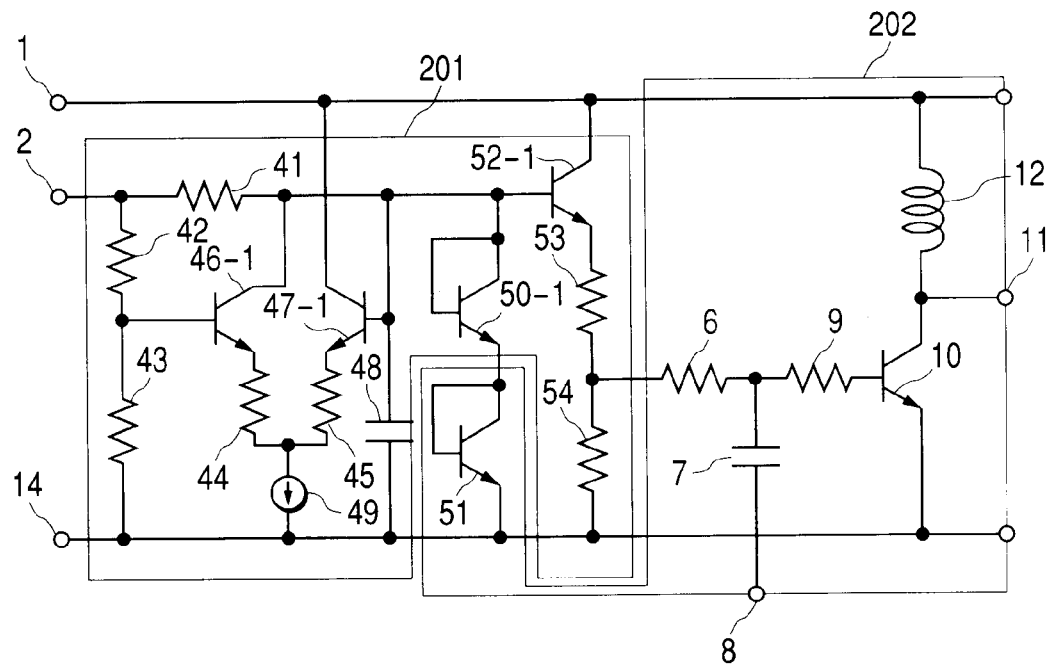
FIG. 4 is a specific circuit diagram of another embodiment of the unit amplifier of FIG. 1.

FIG. 4 is a specific circuit diagram of another embodiment of the unit amplifier of FIG. 1. The configuration shown in FIG. 4 is for the integration of the bias system on a chip and the integration of the power amplification system on another chip. Paired transistors 10 and 51 in a power amplifier IC 202 are GaAs-HBTs, and paired transistors 50-1 and 52-1 in a bias IC 201 are SiGe-HBTs or Si bipolar transistors, both pairs constituting a current mirror.

It is desirable to build resistors 6 and 9 and capacitance 7 into the power amplifier IC 202 and transistors 46-1 and 47-1 constituting an error amplifier, resistors 41 to 45, 53, and 54, and a current source 49 into the bias IC 201. The transistors 46-1 and 47-1 constituting the error amplifier are SiGe-HBTs or Si bipolar transistors. The resistor 54 may be built into the power amplifier IC 202.

Figure 5:
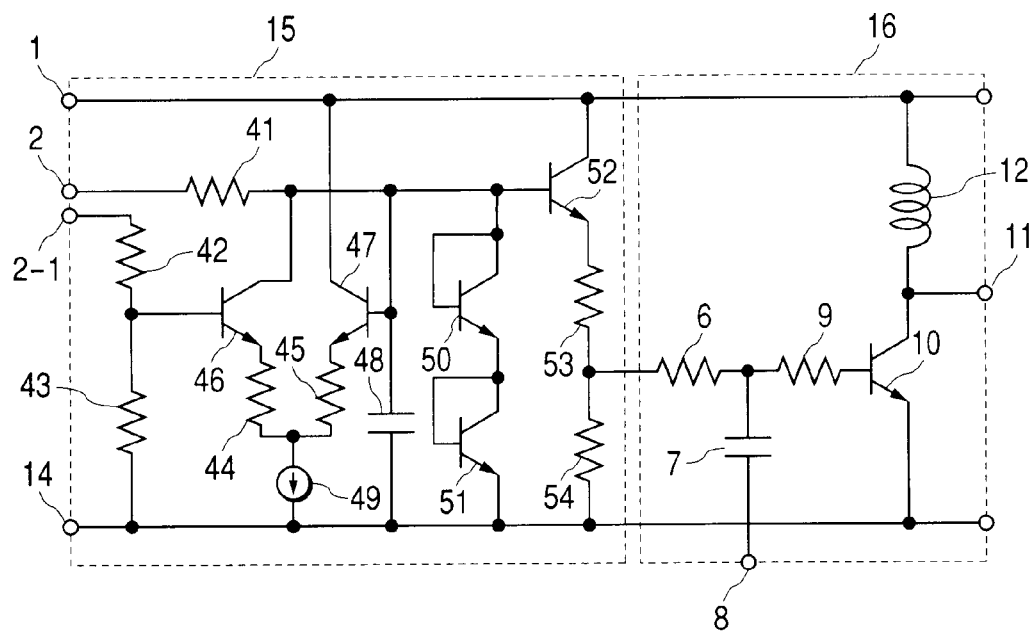
FIG. 5 is a specific circuit diagram of yet another embodiment of the unit amplifier of FIG. 1.

FIG. 5 is a specific circuit diagram of yet another embodiment of the unit amplifier of FIG. 1. As compared with the unit amplifier of FIG. 4, the difference is that the resistor 42 is not connected to the terminal 2, but to an additional terminal 2-1. With this configuration, the current Ireg can be adjusted by connecting an external resistor to the terminal 2 in series; therefore, the idling current Iq can be set to any value. The unit amplifier of FIG. 5 functions in the same way as that of the FIG. 4 if the terminal 2-1 is externally connected to the terminal 2.

If the terminal 2-1 is left open, the base of the transistor 46 of the error amplifier is grounded, and, hence, the error amplifier circuit 4 does not function. Thus, a power amplifier module applicable to portable telephones for cellular systems such as the GSM (Global System for Mobile Communication), the PCN (Personal Communications Network), etc. where the output power is controlled by 0-V, control signals to burst signals of any amplitude can be accomplished. In other words, a single power amplifier module can be used for portable telephones of different systems.

Figure 6:
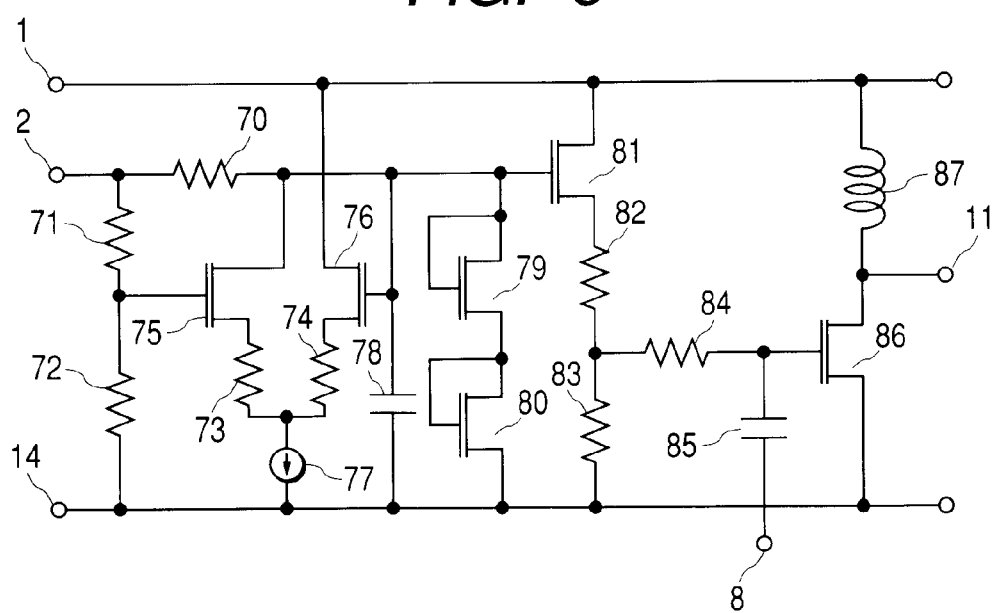
FIG. 6 is a specific circuit diagram of still another embodiment of the unit amplifier of FIG. 1.

FIG. 6 is a specific circuit diagram of still another embodiment of the unit amplifier of FIG. 1. Instead of GaAs-HBTs, SiGe-HBTs, etc. used in the unit amplifiers of FIGS. 2, 4, and 5, MOSFETs are used in this embodiment. In FIG. 6, reference numerals 75, 76, 79 to 81, and 86 are MOSFETs; 70 to 74 and 82 to 83, resistors; 77, a current source; 85, coupling capacitance; and 87, an RF choke inductor.

The workings of this unit amplifier are the same as those of the unit amplifier of FIG. 2. Accordingly, the detailed description of its workings is omitted. Because the transfer conductance of the differential circuit can be adjusted by the gate width of the MOSFETs, the resistors 73 and 74 are dispensable. Besides, because the input current (gate current) of the MOSFET is zero, unlike GaAs-HBTs or the SiGe-HBTs, the resistor 84 can be of a kΩ order; therefore the resistor 82 is dispensable.

Figure 7:
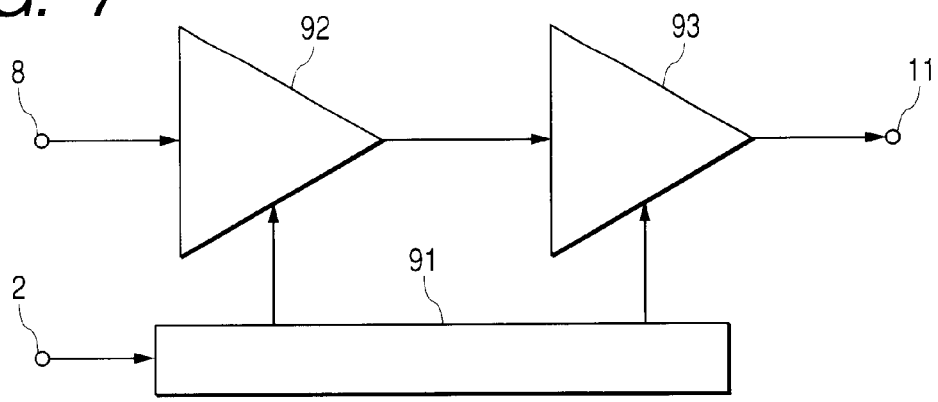
FIG. 7 is a block diagram of an embodiment of the power amplifier module of the present invention.

FIG. 7 is a block diagram of an embodiment of the power amplifier module of the present invention. In general, a power amplifier module consists of two or three unit amplifies connected in series. Shown in FIG. 7 is an example of a two-stage power amplifier module, wherein a bias circuit 91 is applied to power amplifier units 92 and 93. One more power amplifier unit may be added to the module to make it three-stage.

In FIG. 7, a signal input through the terminal 8 is amplified by the power amplifier unit 92 and the power amplifier unit 93 and output through the terminal 11. Idling currents for the power amplifier units 92 and 93 are fed from the bias circuit 91 with a current mirror circuit such as shown in FIG. 2 or FIG. 4. Each power amplifier unit may be provided with a bias circuit, or the output of a bias circuit may be divided and fed to the two power amplifier units. The power amplifier units 92 and 93 and the bias circuit 91 may be integrated onto a single chip, or the power amplifier units 92 and 93 may be integrated onto one chip and the bias circuit 91 may be integrated onto another.

Figure 8:
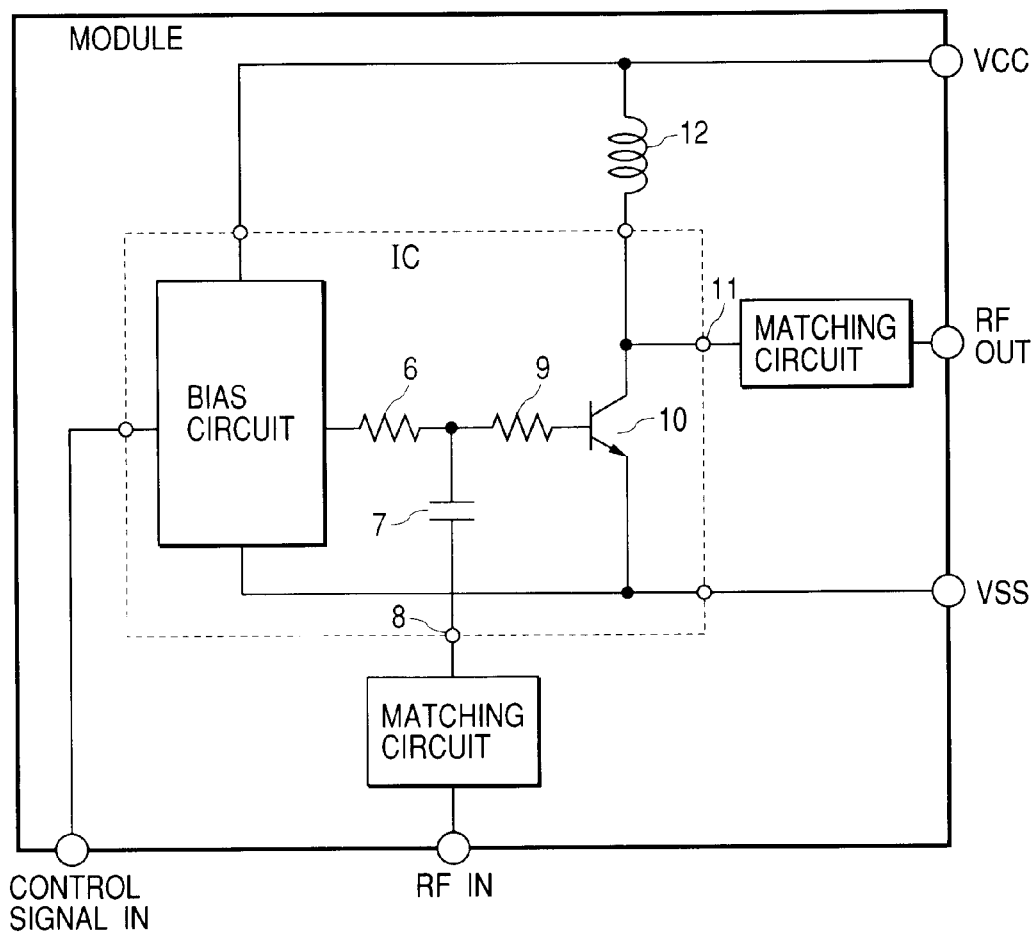
FIG. 8 is a circuit diagram of an embodiment of the power amplifier module of the present invention.

FIG. 8 is a circuit diagram of an embodiment of the power amplifier module of the present invention. In FIG. 8, a representative amplifying stage and a representative bias circuit alone are illustrated. By adding more of the same type of amplifying stage(s) and the same type of bias circuit(s), two-stage or three-stage module can be accomplished. In such two- or three-stage modules, coupling capacitance is provided between amplifying stages to allow high-frequency components alone to pass.

Mounted externally on the PCB of the power amplifier module are an integrated circuit IC comprising a bias circuit and an amplifying transistor, a matching circuit which sends input signals input through an RF input terminal of the module to an input terminal 8 of the integrated circuit IC, a matching circuit which sends output signals output from an output terminal 11 of the integrated circuit IC to an RF output terminal of the module, and an inductor 12 to be connected to the collector of the amplifying transistor 10. A control input terminal of the module is connected to a control voltage terminal of the bias circuit. These circuits elements are mounted on a PCB and sealed to constitute a power amplifier module, which is built into portable telephones as described later.

Figure 9:
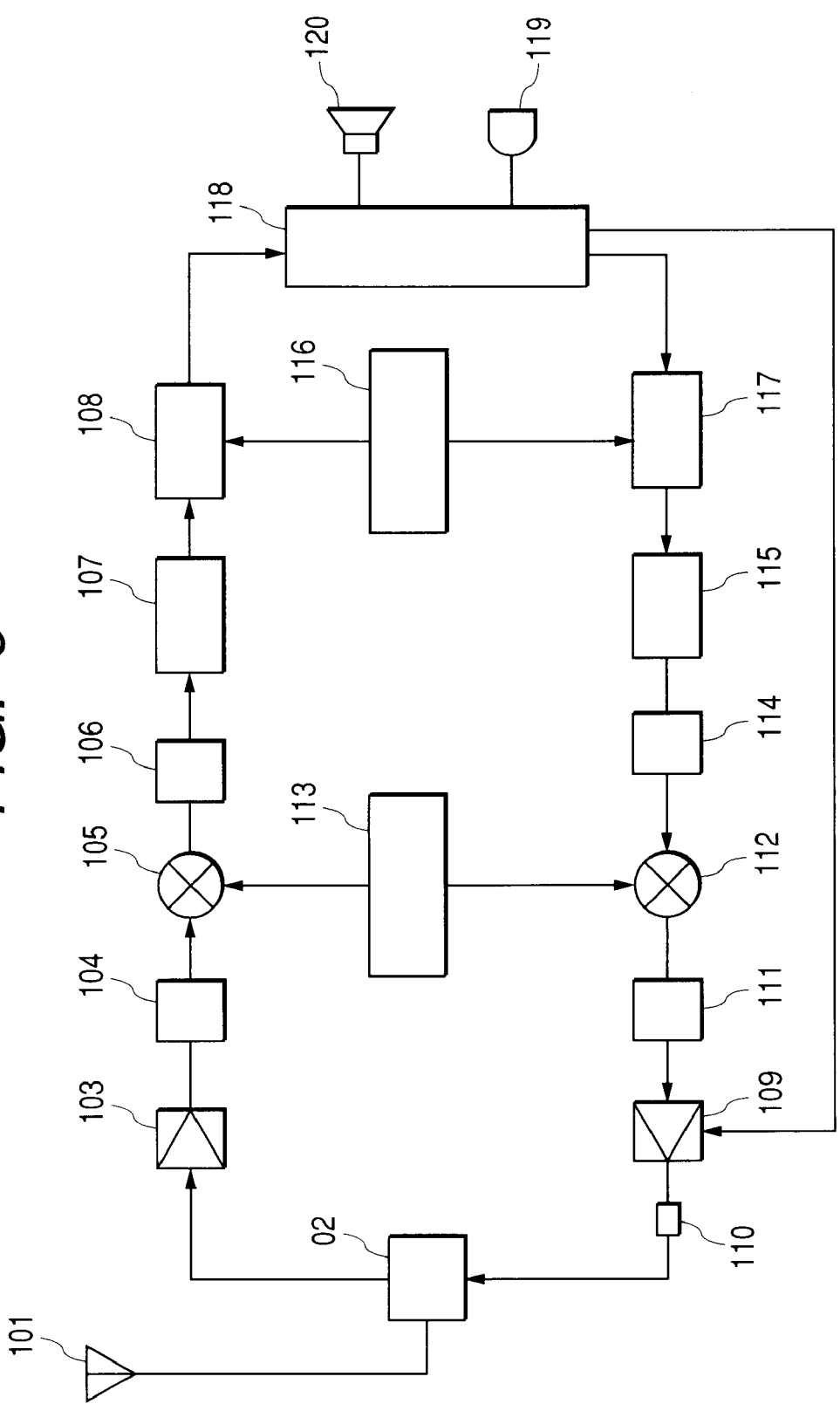
FIG. 9 is a general block diagram of an embodiment of a portable telephone for CDMA mobile telecommunication, noting the power amplifier module of the present invention can be applied to such portable telephones.

FIG. 9 is a general block diagram of an embodiment of a portable telephone for CDMA mobile telecommunication using the power amplifier module of the present invention, which is particularly useful for such portable telephones. Signals received by an antenna 101 are amplified by a receiving front end comprising a common unit 102, an amplifier 103, a filter 104, and a mixer 105. The amplified signals are converted into intermediate-frequency signals by the mixer 105 and converted further into baseband signals by an intermediate signal processing unit comprising a filter 106, a gain controller/amplifier 107, and a down-converter 108. The converted signals are sent to a baseband-signal processing circuit 118. Audio signals are processed by the baseband-signal processing circuit 118 and reproduced by a speaker 120.

On the sending side, signals are processed in reverse order. Sounds and voices are converted by a microphone 119 into electric signals and sent to a mixer 112 through the baseband-signal processing circuit 118, an up-converter 117, a signal attenuator 115, and a filter 114. The signals are converted into sending-frequency band signals by a frequency synthesizer 113 and a mixer 112, unnecessary frequency components are removed from the signals by a filter 111, and the signals are power-amplified by a power amplifier module 109. The signals output from the power amplifier module 109 are sent through an isolator 110 and the common unit 102 to the antenna 101 to be transmitted into air.

The baseband-signal processing circuit 118 generates a control signal to control the workings of the power amplifier module 109. The control signal is set to 0 V while signals are not transmitted so as to stop the workings of the bias circuit of the power amplifier module 109. Because the control signal generated by the baseband-signal processing circuit 118 corresponds to a binary signal generated by a digital circuit of the circuit 118, and, hence, the voltage change of the control signal is relatively large, the stabilization of the idling current at the bias circuit is important for the elongation of battery life and stable telecommunication.

Figure 10:
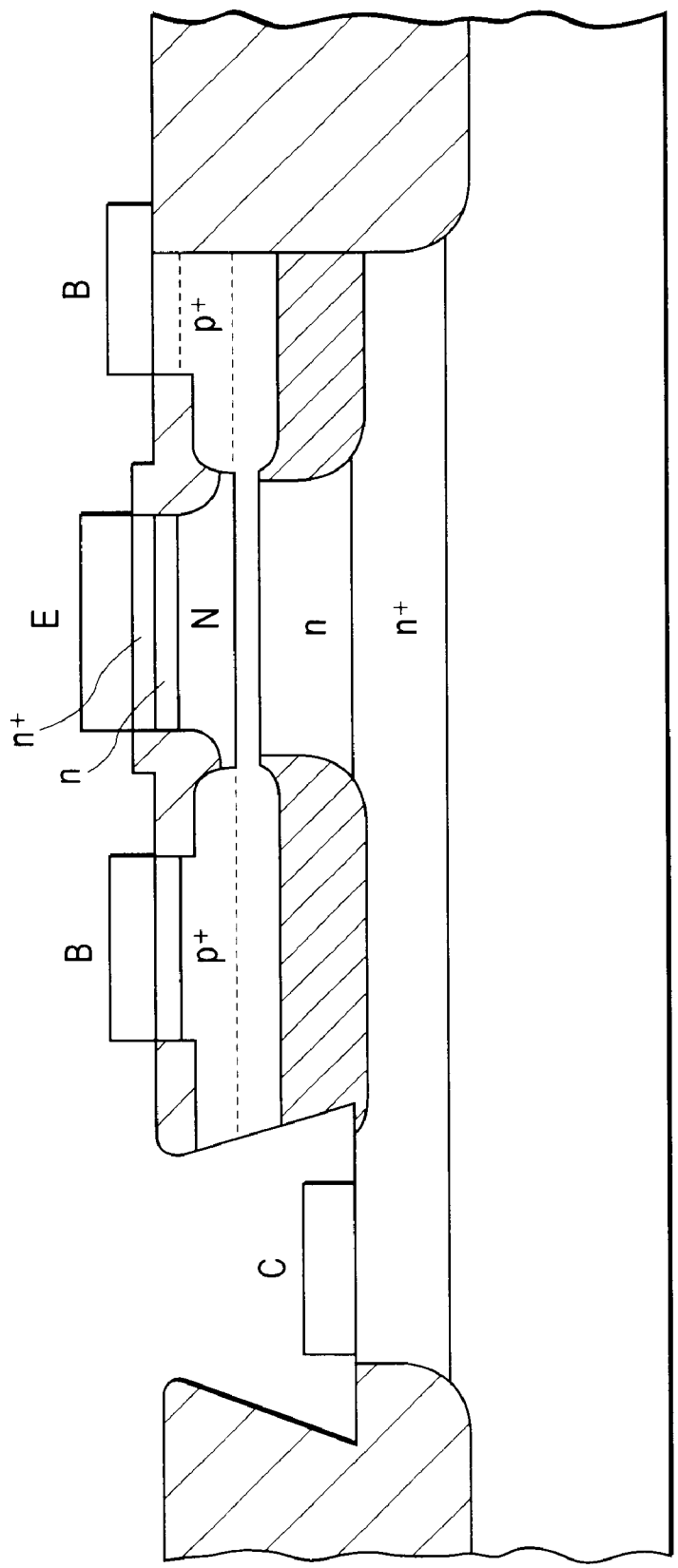
FIG. 10 is a schematic sectional view of an embodiment of a heterojunction bipolar transistor suitable to use in the power amplifier module of the present invention.
Figure 11A:
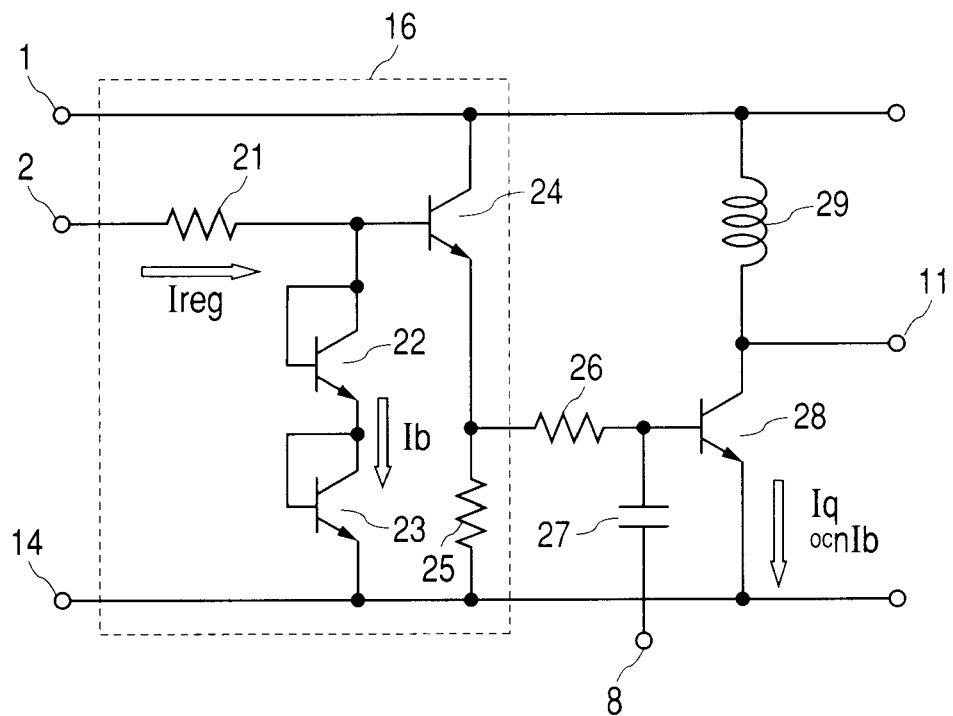
FIGS. 11A and 11B are a circuit diagrams showing examples of the prior art.
Figure 11B:
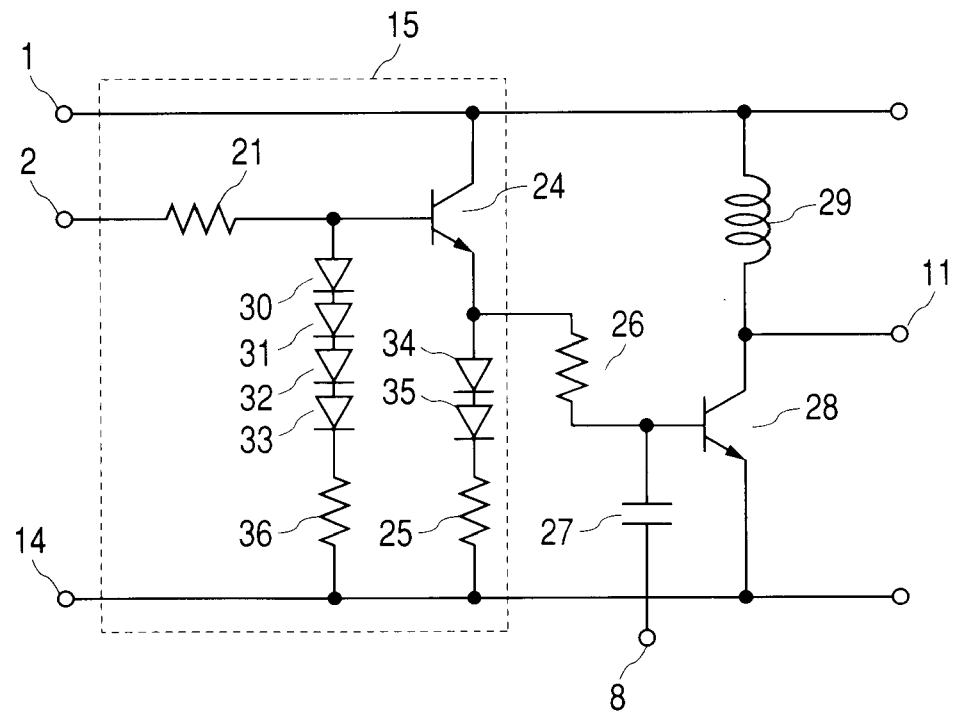

FIG. 10 is a schematic sectional view of an embodiment of the heterojunction bipolar transistor suitable to use in the power amplifier module of the present invention. A semiconductor of a wide band gap is used for the emitter of the heterojunction bipolar transistor. Because the reverse injection of minority carriers from the base to the emitter is held down by the wide-band-gap emitter, the injection efficiency of the emitter, and, hence, the current gain are high. Even if the carrier density of the base is raised, a high current gain can be maintained and the resistance of the base can be lowered. Therefore, very-high-speed operation with a high current gain and a high driving capacity of the transistor is possible.

In this embodiment, the carrier density of the collector Nc is lowered to reduce the capacitance between the base and the collector Cbc. The necessary collector field is the area for the emitter-base junction, and, hence, the external base-collector capacitance Cbc under the base electrode B is a parasitic extra capacitance. To reduce the capacitance Cbc, oxygen $O_2$ is injected into the n⁻ field for insulation.

As described above, the bias circuit of the present invention enables feeding stable idling currents to power amplifier units under environmental changes such as changes of ambient temperature and control voltage. Therefore, a power amplifier module with high linearity and efficiency can be accomplished. Besides, all the active elements of the power amplifier module including diodes for temperature compensation can be formed collectively by a GaAs-HBT, SiGe-HBT, or MOSFET process. Accordingly, the yield can be raised and the production cost can be reduced.

While particular embodiments of the present invention have been shown, the invention is not restricted to such embodiments, and it is apparent that changes and modifications may be made without departing from the spirit of the invention. For example, when providing a plurality of amplifying stages as in the embodiment of FIG. 7, a GaAs-HBT showing a high driving capacity and a SiGe-HBTs are used as an element to amplify signals. Further, among bias circuits, since fast operation is not required in an error amplification circuit, a circuit comprising conventional bipolar transistors or MOSFETs is used. Thus, in the case where a plurality of ICs and external parts are mounted on a PCB, a resistor producing the previously described current Ireg may be comprised of an external element. In such a case, process variations in a semiconductor integrated circuit device can be reduced, and the idling current can be set to any value. This invention can be applied to various portable telephones, etc. as a power amplification module, as well as other types of devices.

The advantages offered by the representative examples of the invention disclosed in this application are as follows. A differential circuit makes error amplification with a first means for detecting changes of control voltage and a second means for detecting changes of ambient temperature as mutual standard voltage source inputs to produce an idling current wherein the effects of the changes of the control voltage and the ambient temperature are removed. The idling current controls the gain of a power-amplifying transistor. Input signals are fed to the power-amplifying transistor through a first matching circuit, and output signals from the power-amplifying transistor are fed to a load circuit through a second matching circuit. Thus, stable idling currents are fed to power amplifier units under environmental changes such as changes of ambient temperature and control voltage. Therefore, a power amplification module with high linearity and efficiency can be accomplished.

What is claimed is:

1. A power amplifier module comprising:
   a bias circuit to produce an idling current; and
   a power amplifier of which gain is controlled by said idling current produced by said bias circuit,
   wherein effects of changes of control voltage and ambient temperature of said power amplifier module can be removed by a first detector in said bias circuit to detect changes of the control voltage and a second detector in said bias circuit to detect changes of the ambient temperature;
   wherein said bias circuit further comprises a differential circuit to make error amplification with said first detector provided to perform as a standard voltage source for ambient-temperature detection by of said second detector and said second detector provided to perform as a standard voltage source for control-voltage detection by of said first detector.

2. The power amplifier module according to claim 1,
   wherein said power amplifier module further comprises:
   a first matching circuit to apply an input signal to said power amplifier; and
   a second matching circuit to apply an output signal of said power amplifier to an output terminal of said power amplifier module.

3. The power amplifier module according to claim 2,
   wherein said bias circuit, said power amplifier, said first matching circuit and said second matching circuit are monolithically mounted on a circuit board.

4. The power amplifier module according to claim 2,
   wherein said power amplifier module has a plurality of power-amplifying transistors provided in series,
   wherein said first matching circuit is connected to an input transistor of the plurality of said power-amplifying transistors in series, and
   wherein said second matching circuit is connected to an output transistor of the plurality of said power-amplifying transistors in series.

5. The power amplifier module according to claim 4,
   wherein said bias circuit is coupled to each of said power-amplifying transistors.

6. The power amplifier module according to claim 2, further comprising a power-amplifying transistor,
   wherein said first detector further comprises a voltage-dividing-resistor circuit to divide the control voltage,
   wherein said second detector further comprises transistors in diode connection, the transistors in diode connection having substantially a same structure as said power-amplifying transistor, the power-amplifying transistor and the transistors in diode connection constituting a current mirror,
   wherein said idling current of said bias circuit is generated from a first resistive element provided in said bias circuit, between an input terminal of the control voltage and the base of said power-amplifying transistor, and
   wherein said differential circuit of said bias circuit stabilizes the current passing through said first resistive element by the error-amplifying performance of said differential circuit to stabilize the idling current.

7. The power amplifier module according to claim 6,
   wherein said transistors in diode connection of said second detector are in a configuration of a first transistor and a second transistor,
   wherein said power-amplifying transistor and another power-amplifying transistor are provided in a configuration of a third transistor and a fourth transistor in a Darlington connection, respectively, and
   wherein at least a second resistive element is provided between the emitter of said third transistor and the base of said fourth transistor, and the input signal is fed through a coupling capacitance to the base of said fourth transistor.

8. The power amplifier module according to claim 7,
   wherein said differential circuit further comprises transistors which have substantially the same structure as said power-amplifying transistors,
   wherein said bias circuit and said power-amplifying transistors are integrated into a single semiconductor integrated circuit, and
   wherein said first and second matching circuits are mounted, as parts external of the semiconductor integrated circuit, on said printed circuit board.

9. The power amplifier module according to claim 8,
   wherein said transistors used in said bias circuit and said power-amplifying transistors are heterojunction bipolar transistors.

10. The power amplifier module according to claim 8,
    wherein said transistors used in said bias circuit and said power-amplifying transistors are metal-oxide-semiconductor field effects transistors.

11. The power amplifier module according to claim 6,
    wherein said voltage dividing circuit of said first detector has an external terminal through which the control voltage is input into said voltage dividing circuit.

12. The power amplifier module according to claim 2, wherein said power amplifier comprises a power-amplifying transistor and said bias circuit includes transistors in diode connection, which generate a base-emitter bias voltage of said power-amplifying transistor and which are formed with said power amplifying transistor on a first semiconductor chip, wherein said bias circuit, except said transistors in diode connection for generating the bias voltage, are formed on a second semiconductor chip, wherein said first semiconductor chip is constituted by one of GaAs- and SiGe-heterojunction bipolar transistors, and wherein said second semiconductor chip is constituted by one of Si bipolar transistors and metal-oxide-semiconductor field effects transistors.

13. A power amplifier module comprising:

a bias circuit to produce an idling current; and a power amplifier of which gain is controlled by said idling current produced by said bias circuit, wherein said bias circuit further includes an ambient temperature detector to detect changes of ambient temperature so that effects of changes of ambient temperature of said power amplifier module can be removed by the ambient temperature detector without using Schottky diodes;

wherein said bias circuit further includes a control voltage detector to detect changes of control voltage so that effects of changes of control voltage of said power amplifier module can be removed by the control voltage detector;

wherein said bias circuit further comprises a differential circuit to make error amplification with said control voltage detector provided to perform as a standard voltage source for ambient-temperature detection of said ambient temperature detector and said ambient temperature detector provided to perform as a standard voltage source for control-voltage detection of said control voltage detector.

14. The power amplifier module according to claim 13, wherein said power amplifier module further comprises:
a first matching circuit to apply an input signal to said power amplifier; and
a second matching circuit to apply an output signal of said power amplifier to an output terminal of said power amplifier module.

15. A power amplifier module comprising:

a bias circuit for producing an idling current so that effects of changes of control voltage and ambient temperature can be removed;

a power-amplifying transistor of which gain is controlled by the idling current produced by said bias circuit;

a first matching circuit for feeding an input signal to the power-amplifying transistor; and a second matching circuit for feeding an output signal of the power amplifier circuit to a load circuit, wherein said bias circuit comprises:
first means for detecting changes of control voltage of the module;
a second means for detecting changes of ambient temperature of the module; and
a differential circuit for making error amplification with the first means serving as a standard voltage source for ambient-temperature detection and the second means serving as a standard voltage source for control-voltage detection, and
wherein said bias circuit, said power-amplifying transistor, and said first and second matching circuits are mounted on a printed circuit board.

* * * * *